United States Patent
Akimoto et al.

(10) Patent No.: US 8,933,480 B2
(45) Date of Patent: Jan. 13, 2015

(54) SEMICONDUCTOR LIGHT EMITTING DEVICE AND METHOD FOR MANUFACTURING SAME

(75) Inventors: Yosuke Akimoto, Kanagawa-ken (JP); Akihiro Kojima, Kanagawa-ken (JP); Miyuki Iduka, Kanagawa-ken (JP); Yoshiaki Sugizaki, Kanagawa-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 411 days.

(21) Appl. No.: 12/793,945

(22) Filed: Jun. 4, 2010

(65) Prior Publication Data

US 2011/0204396 A1    Aug. 25, 2011

(30) Foreign Application Priority Data

Feb. 24, 2010 (JP) ................. 2010-039330

(51) Int. Cl.
| | |
|---|---|
| *H01L 33/00* | (2010.01) |
| *H01L 33/48* | (2010.01) |
| *H01L 33/38* | (2010.01) |
| *H01L 33/54* | (2010.01) |
| *H01L 33/62* | (2010.01) |

(52) U.S. Cl.
CPC ............ *H01L 33/486* (2013.01); *H01L 33/385* (2013.01); *H01L 33/54* (2013.01); *H01L 33/0079* (2013.01); *H01L 33/62* (2013.01); *H01L 2933/0016* (2013.01); *H01L 2924/0002* (2013.01)
USPC ................................... 257/99; 257/E21.599

(58) Field of Classification Search
USPC ..................... 257/99, 98, E21.599
See application file for complete search history.

(56) References Cited

U.S. PATENT DOCUMENTS

| | | | |
|---|---|---|---|
| 6,281,524 B1 | 8/2001 | Yamamoto et al. | |
| 6,404,792 B1 | 6/2002 | Yamamoto et al. | |
| 6,518,601 B2 * | 2/2003 | Wirth .............................. | 257/98 |

(Continued)

FOREIGN PATENT DOCUMENTS

| | | |
|---|---|---|
| JP | 2007/123517 A | 5/2007 |
| JP | 2007-523483 | 8/2007 |

(Continued)

OTHER PUBLICATIONS

Extended European Search Report for European Patent Application No. 10165062.0 mailed on Jul. 6, 2011.
The European examination report issued on May 2, 2013 in the counterpart European patent application No. 10165062.0.

(Continued)

*Primary Examiner* — Matthew Reames
(74) *Attorney, Agent, or Firm* — White & Case LLP

(57) ABSTRACT

According to one embodiment, a semiconductor light emitting device includes a semiconductor stack, a first electrode, a second electrode, a first interconnect, an insulating film, and a second interconnect. The semiconductor stack includes a first major surface, a second major surface provided on a side opposite to the first major surface, a side face, and a light emitting layer. The first electrode is provided on the first major surface. The second electrode is provided at least on a peripheral portion of the second major surface. The first interconnect is provided on the first electrode. The insulating film is provided on the side face of the semiconductor stack. The second interconnect is provided on the side face of the semiconductor stack via the insulating film. The second interconnect is connected to the second electrode in outside of the peripheral portion of the second major surface of the semiconductor stack.

9 Claims, 11 Drawing Sheets

(56) References Cited

U.S. PATENT DOCUMENTS

| | | |
|---|---|---|
| 2003/0013217 A1 | 1/2003 | Dudoff et al. |
| 2006/0006404 A1 | 1/2006 | Ibbetson et al. |
| 2007/0034995 A1 | 2/2007 | Kameyama et al. |
| 2008/0035935 A1* | 2/2008 | Shum .............................. 257/79 |
| 2009/0289273 A1 | 11/2009 | Tsai et al. |
| 2010/0148198 A1 | 6/2010 | Sugizaki et al. |
| 2011/0114978 A1 | 5/2011 | Kojima et al. |
| 2011/0114986 A1 | 5/2011 | Kojima et al. |
| 2011/0220910 A1 | 9/2011 | Kojima et al. |
| 2011/0220931 A1 | 9/2011 | Kojima |

FOREIGN PATENT DOCUMENTS

| | | |
|---|---|---|
| WO | 2005/043631 A2 | 5/2005 |
| WO | 2006/005062 A2 | 1/2006 |
| WO | 2009/064330 | 5/2009 |

OTHER PUBLICATIONS

Japanese Office Action for Japanese Application No. 2010-039330 issued on May 17, 2012.

Taiwanese Office Action for Taiwanese Application No. 099129339 issued on Mar. 22, 2013.

\* cited by examiner

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2010-039330, filed on Feb. 24, 2010; the entire contents of which are incorporated herein by reference.

BACKGROUND

A known semiconductor light emitting device has a structure in which electrodes are provided on one major surface of a semiconductor stack including a light emitting layer and on another major surface on the side opposite thereto. In the case of such a so-called opposite electrode structure, a bonding pad is formed on the light extraction face to perform wire bonding to an external circuit. The portion where the bonding pad is provided undesirably blocks the light.

DETAILED DESCRIPTION

According to one embodiment, a semiconductor light emitting device includes a semiconductor stack, a first electrode, a second electrode, a first interconnect, an insulating film, and a second interconnect. The semiconductor stack includes a first major surface, a second major surface provided on a side opposite to the first major surface, a side face, and a light emitting layer. The first electrode is provided on the first major surface. The second electrode is provided at least on a peripheral portion of the second major surface of the semiconductor stack. The first interconnect is provided on the first electrode. The insulating film is provided on the side face of the semiconductor stack. The second interconnect is provided on the side face of the semiconductor stack via the insulating film. The second interconnect is connected to the second electrode in outside of the peripheral portion of the second major surface of the semiconductor stack.

Embodiments will now be described with reference to the drawings.

Figure 1:
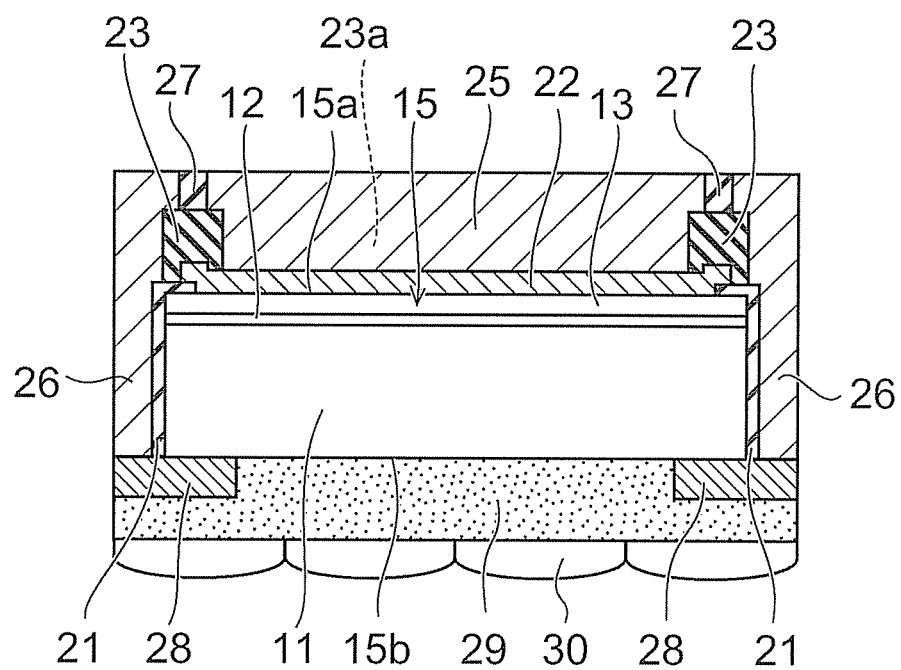
FIG. 1 is a schematic cross-sectional view of a semiconductor light emitting device of an embodiment.

FIG. 1 is a schematic cross-sectional view of a semiconductor light emitting device of this embodiment.

The semiconductor light emitting device of this embodiment includes a semiconductor stack 15 including a light emitting layer (an active layer) 12, an interconnect structure portion for supplying current to the light emitting layer 12, and a phosphor layer 29. These components are formed collectively in a wafer state as described below.

The semiconductor stack 15 includes an n-type semiconductor layer 11, the light emitting layer 12, and a p-type semiconductor layer 13. The light emitting layer 12 is provided, between the n-type semiconductor layer 11 and the p-type semiconductor layer 13. For example, the n-type semiconductor layer 11 is an n-type GaN layer; and the p-type semiconductor layer 13 is a p-type GaN layer. The light emitting layer 12 has, for example, a multiple quantum well structure including InGaN.

An insulating film 21 such as, for example, a silicon oxide film is formed on the side face of the semiconductor stack 15. The insulating film 21 is formed also on the peripheral portion of a first major surface 15a of the semiconductor stack 15. A p-side electrode 22 is formed as a first electrode on most of the first major surface 15a excluding the peripheral portion. The p-side electrode 22 is electrically connected to the p-type semiconductor layer 13 with ohmic contact.

A p-side interconnect 25 is provided as a first interconnect on the p-side electrode 22. An n-side interconnect 26 is provided as a second interconnect on the side face of the semiconductor stack 15 via the insulating film 21. The n-side interconnect 26 protrudes from the side face of the semiconductor stack 15 to the p-side interconnect 25 side of the first major surface 15a. An insulator 23 and a resin 27 of, for example, polyimide are provided between the n-side interconnect 26 and the p-side interconnect 25 to insulatively separate the n-side interconnect 26 and the p-side interconnect 25.

An n-side electrode 28 is formed as a second electrode on a second major surface 15b of the semiconductor stack 15 on a side opposite to the first major surface 15a. The n-side electrode 28 is formed on the peripheral portion of the second major surface 15b. The n-side electrode 28 is formed also outside of the second major surface 15b in the surface direction. The portion of the n-side electrode 28 outside of the second major surface 15b is connected to an end portion of the n-side interconnect 26 on the second major surface 15b side. The n-side interconnect 26 and the n-side electrode 28 are made of metal materials. The n-side interconnect 26 and the n-side electrode 28 are metallically bonded. The n-side electrode 28 is electrically connected to the second major surface 15b with ohmic contact.

Figure 2A:
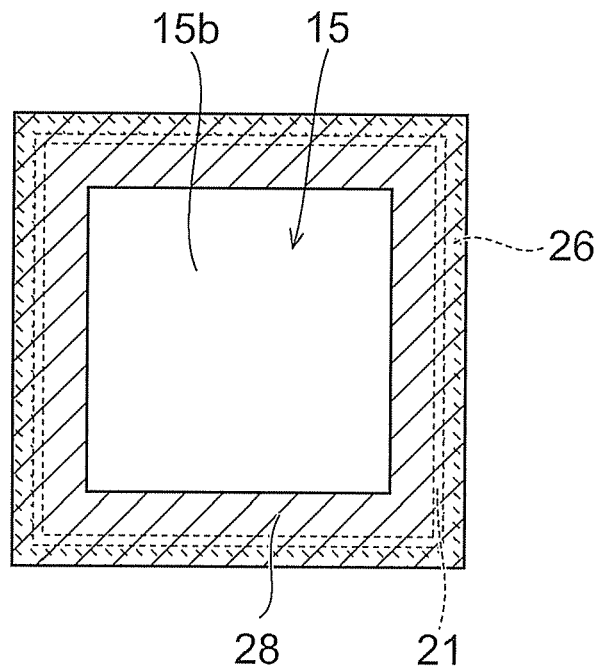
FIG. 2A shows a plan layout of main component of the semiconductor light emitting device.

FIG. 2A is an example of a planar layout of the n-side electrode 28.

The n-side electrode 28 is formed in a continuous ring on the peripheral portion of the second major surface 15b to enclose the center of the second major surface 15b. The n-side interconnect 26 provided on the side face of the semiconductor stack 15 continuously covers the periphery of the semiconductor stack 15 via the insulating film 21.

Figure 10A:
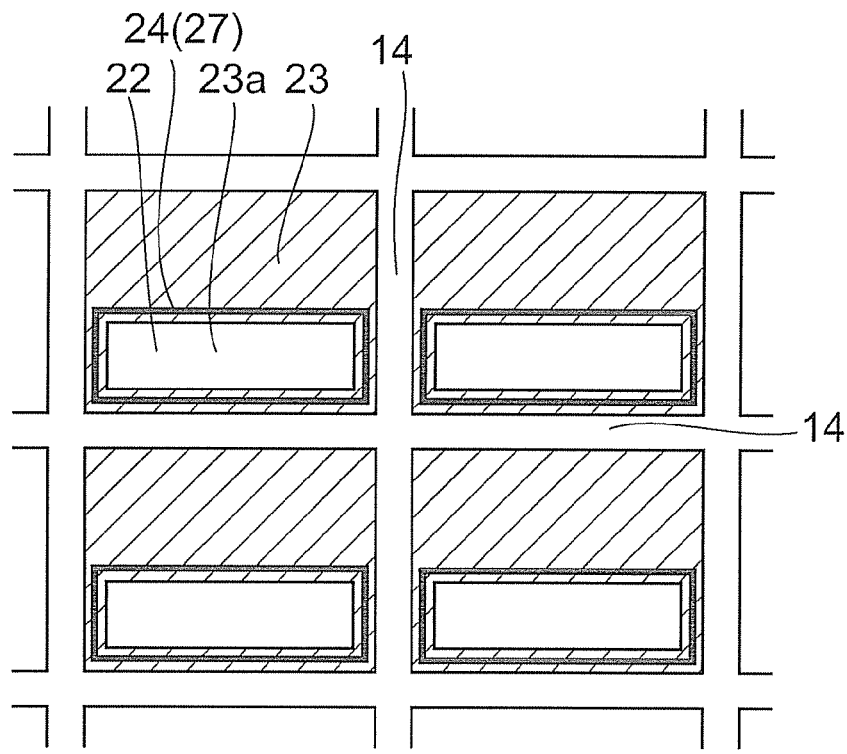
Figure 10B:
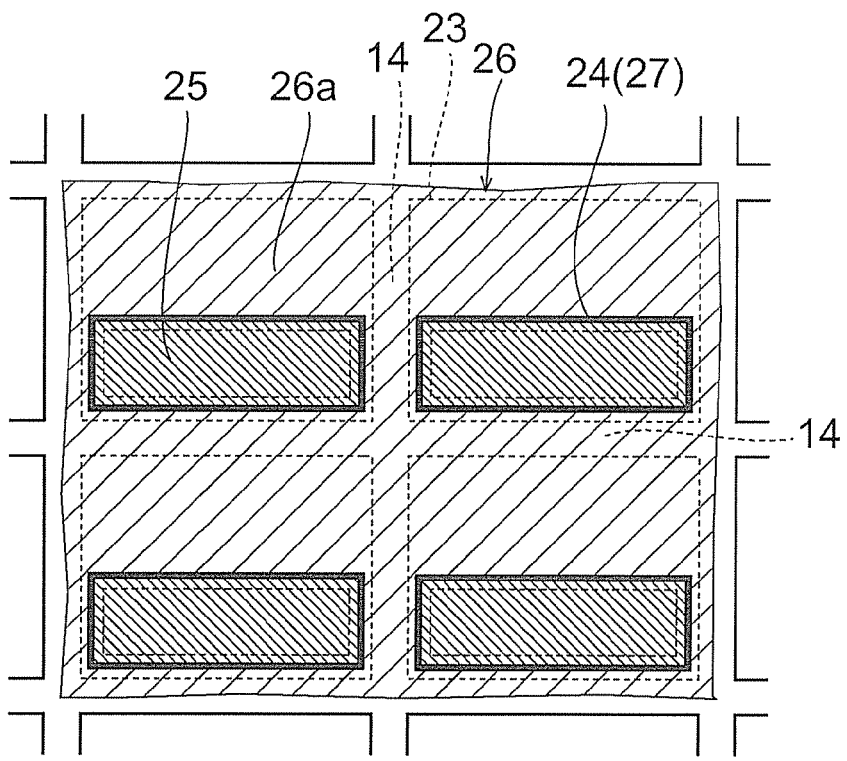

FIG. 10A is an example of a planar layout of the insulator 23 and the resin 27. FIG. 10B is an example of a planar layout of the n-side interconnect 26 and the p-side interconnect 25. FIGS. 10A and 10B illustrate the wafer state.

The insulator 23 is provided on the p-side electrode 22. An opening 23a is made in a portion of the insulator 23. The resin 27 is provided on the insulator 23 around the opening 23a. The resin 27 continuously encloses the periphery of the opening 23a.

The p-side interconnect 25 is provided in the region enclosed with the resin 27. The p-side interconnect 25 is connected to the p-side electrode 22 through the opening 23a.

The n-side interconnect 26 includes the portion provided on the side face of the semiconductor stack 15 and a pad portion 26a that protrudes to the p-side interconnect 25 side of the first major surface 15a and spreads over the insulator 23. The pad portion 26a of the n-side interconnect 26 is provided on the non-opening portion of the insulator 23 outside of the region enclosed with the resin 27.

The p-side interconnect 25 and the pad portion 26a of the n-side interconnect 26 are provided in regions on the first major surface 15a and the p-side electrode 22 without overlapping each other. The insulator 23 is interposed between the p-side electrode 22 and the pad portion 26a. The insulator and the resin 27 are interposed between the p-side interconnect 25 and the pad portion 26a. Two regions on the first major surface 15a are separated by the insulator 23 and the resin 27. The p-side interconnect 25 is provided in one region. The pad portion 26a of the n-side interconnect 26 is provided separately in the other region. Thereby, the increase of the thickness and the planar size of the entire device can be suppressed.

The p-type semiconductor layer 13 is electrically connected to the p-side interconnect 25 via the p-side electrode 22. The n-type semiconductor layer 11 is electrically connected to the n-side interconnect 26 via the n-side electrode 28. The insulating film 21 is interposed between the n-side interconnect 26 and the side faces of the p-type semiconductor layer 13 and the light emitting layer 12 to insulate the n-side interconnect 26 from the p-type semiconductor layer 13 and the light emitting layer 12.

An upper area of the n-side interconnect 26 is larger than a contact area between the n-side interconnect 26 and the n-side electrode 28. The upper area of the n-side interconnect 26 is used as an external terminal for connecting to a circuit board or the like. An upper area of the p-side interconnect 25 is larger than a contact area between the p-side interconnect 25 and the p-side electrode 22. The upper area of the p-side interconnect 25 is used as an external terminal for connecting to a circuit board or the like.

External terminals (not illustrated) such as, for example, solder balls, metal bumps, etc., are provided on the p-side interconnect 25 and the pad portion 26a of the n-side interconnect 26. The semiconductor light emitting device is electrically connectable to an external circuit via the external terminals.

According to the structure of this embodiment, it is possible to maintain mechanical strength by making the p-side interconnect 25, the pad portion 26a of the n-side interconnect 26, and the insulator 23 in a thick pillar configuration without supporting the semiconductor stack 15 with a substrate. In the case of being mounted onto a circuit substrate and the like, the stress applied to the semiconductor stack 15 via the external terminals is mitigated by being absorbed by the p-side interconnect 25, the pad portion 26a of the n-side interconnect 26, and the insulator 23.

The materials of the n-side interconnect 26 and the p-side interconnect 25 may include copper, gold, nickel, silver, etc. Thereamong, copper is more favorable due to good thermal conductivity, high migration resistance, and excellent adhesion with the insulating film.

The phosphor layer 29 is provided on the second major surface 15b of the semiconductor stack 15. The phosphor layer 29 covers the n-side electrode 28. Light emitted by the light emitting layer 12 mainly passes through the n-type semiconductor layer 11, the second major surface 15b, the phosphor layer 29, and is emitted externally.

The phosphor layer 29 is capable of absorbing the light from the light emitting layer 12 and emitting wavelength-converted light. Therefore, mixed light of the light from the light emitting layer 12 and the wavelength-converted light of the phosphor layer 29 may be emitted. It is possible to obtain white light, lamp light, and the like by a mixture of, for example, blue light from the light emitting layer 12 in the case where the light emitting layer 12 is a nitride and, for example, yellow light of the wavelength-converted light of a yellow phosphor layer 29.

A lens 30 made of, for example, resin may be provided as necessary on the surface of the phosphor layer 29 on the side opposite to the second major surface 15b.

In this embodiment, the p-side electrode 22 and the n-side electrode 28 are formed on the first major surface 15a and the second major surface 15b, respectively, of mutually opposite sides of the semiconductor stack 15 including the light emitting layer 12. It is unnecessary to form the n-side electrode 28 on the first major surface 15a side. Accordingly, the p-side electrode 22 can be formed on most of the first major surface 15a excluding the peripheral portion; the surface area contributing to light emission can be increased; and the luminance can be improved. It is unnecessary to form a stepped structure in which the n-type semiconductor layer 11 is exposed on the first major surface 15a side adjacent to a protrusion including the light emitting layer 12 and the p-type semiconductor layer 13. Thereby, it is possible to suppress an increase of the planar size of the semiconductor light emitting device.

While having an opposite electrode structure as described above, both the p-side interconnect 25 and the n-side interconnect 26, which perform the connections to the external circuit, are provided on the first major surface 15a side. The n-side electrode 28 on the second major surface 15b side is connected to the pad portion 26a on the first major surface 15a side via the n-side interconnect 26 provided on the side face of the semiconductor stack 15. Accordingly, it is unnecessary to provide, for example, a bonding pad for wire bonding on the second major surface 15b side. Therefore, the light extraction efficiency is not reduced due to the bonding pad blocking the light that is extracted from the second major surface 15b side.

The n-side interconnect 26 is made of a metal material and is light-blocking to the light emitted by the light emitting layer 12. The n-side interconnect 26 continuously covers the side face (the periphery) of the semiconductor stack 15 including the light emitting layer 12. Accordingly, the light from the side face of the light emitting layer 12 may be blocked by the n-side interconnect 26. Although the light from the side face of the light emitting layer 12 that is emitted externally without passing through the phosphor layer 29 may cause chromaticity shift, the chromaticity shift can be suppressed by the n-side interconnect 26 blocking the light from the side face.

Because of the structure in which the side face of the semiconductor stack 15 is covered with the metal n-side interconnect 26, excellent heat dissipation is provided; and the effects of heat on the product life can be reduced. Because a portion of the phosphor layer 29 covers and is in contact with the metal n-side electrode 28, the heat dissipation of the phosphor layer 29 also can be improved.

A method for manufacturing the semiconductor light emitting device of this embodiment will now be described with reference to FIG. 3A to FIG. 10B. FIG. 3A to FIG. 8B illustrate schematic cross-sections of the wafer state. FIG. 9A to FIG. 10B are schematic plan views of the wafer state.

Figure 3A:
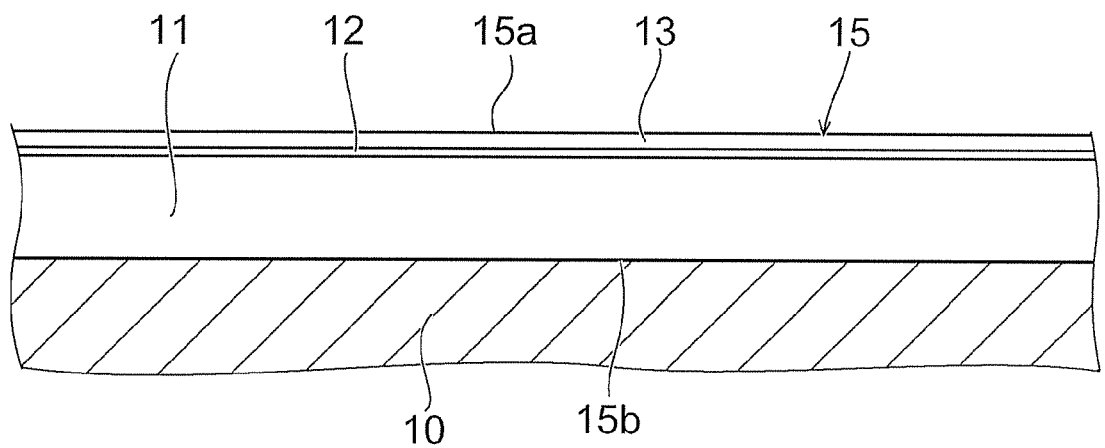
FIG. 3A to FIG. 8B are schematic cross-sectional views illustrating a method for manufacturing a semiconductor light emitting device of this embodiment.

As illustrated in FIG. 3A, the semiconductor stack 15 including the n-type semiconductor layer 11, the light emitting layer 12, and the p-type semiconductor layer 13 is formed on the major surface of a substrate 10. The n-type semiconductor layer 11 is formed on the substrate 10; the light emitting layer 12 is formed on the n-type semiconductor layer 11; and the p-type semiconductor layer 13 is formed on the light emitting layer 12. For example, in the case where the semiconductor stack 15 is a nitride semiconductor, the semiconductor stack 15 may be grown as a crystal on a sapphire substrate.

Figure 3B:
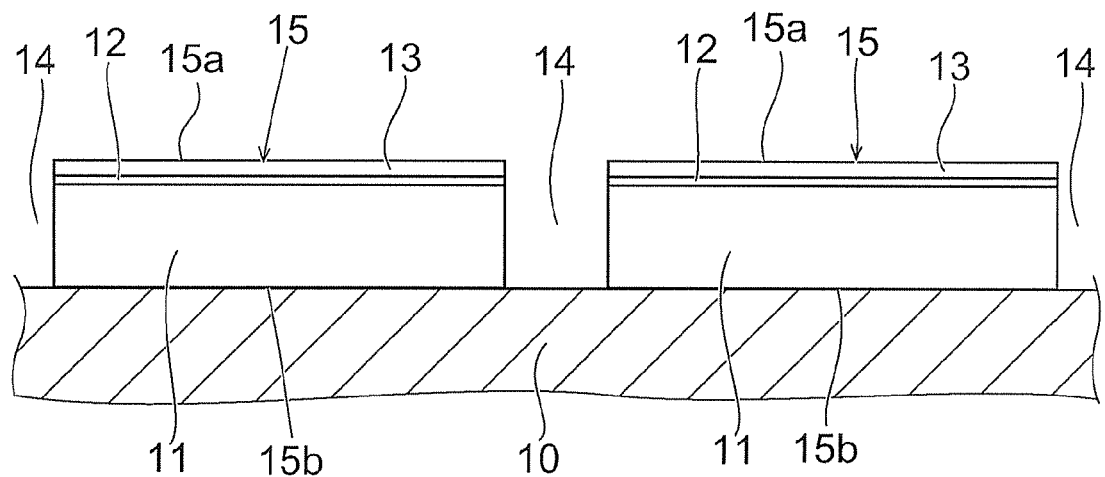
Figure 9A:
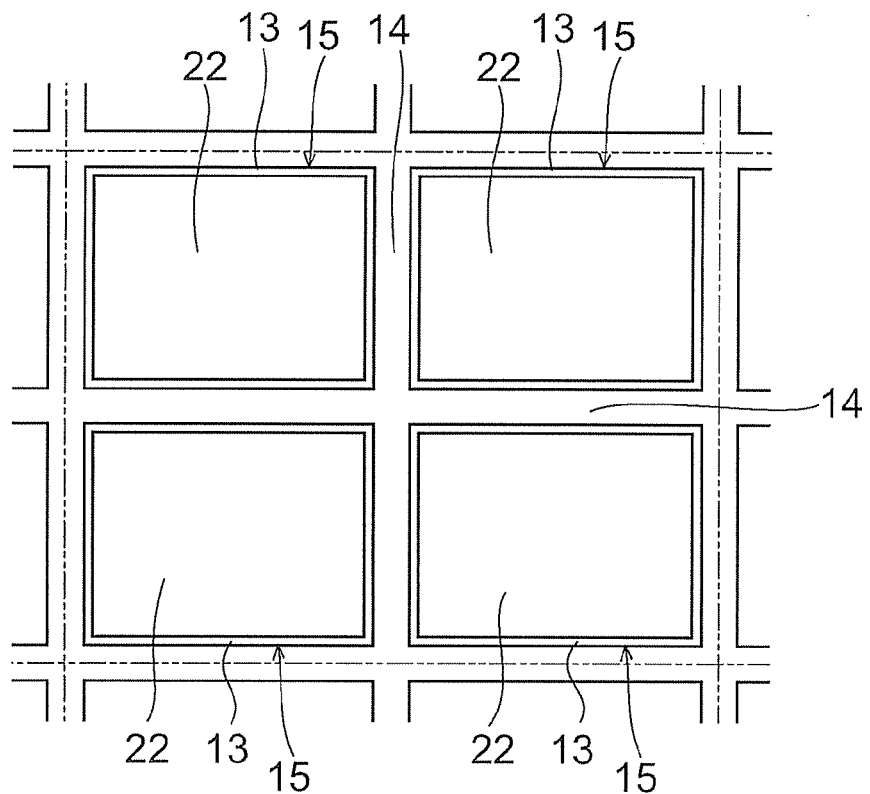
FIG. 9A to FIG. 10B are schematic plan views illustrating the method for manufacturing a semiconductor light emitting device of this embodiment.

Then, a portion of the semiconductor stack 15 is removed by, for example, RIE (Reactive Ion Etching) using a not-illustrated mask. Thereby, as illustrated in FIG. 3B, a trench 14 is made to separate the semiconductor stack 15 into multiple semiconductor stacks 15 on the substrate 10. The trench 14 pierces the p-type semiconductor layer 13, the light emitting layer 12, and the n-type semiconductor layer 11 to reach the substrate 10. As illustrated in FIG. 9A, the trench 14 is formed, for example, in a planar pattern having a lattice configuration.

Figure 4A:
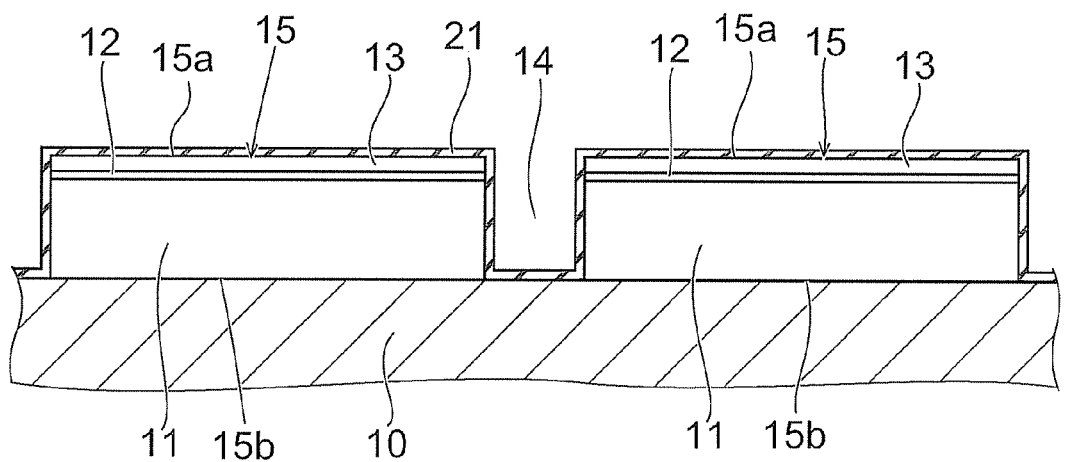

Continuing as illustrated in FIG. 4A, the entire surface of the exposed portions on the substrate 10 are covered with the insulating film 21 of, for example, a silicon oxide film and the like. The insulating film 21 is formed on the upper face of the semiconductor stack 15, the side face of the semiconductor stack 15 exposed at the side face of the trench 14, and the bottom of the trench 14.

Figure 4B:
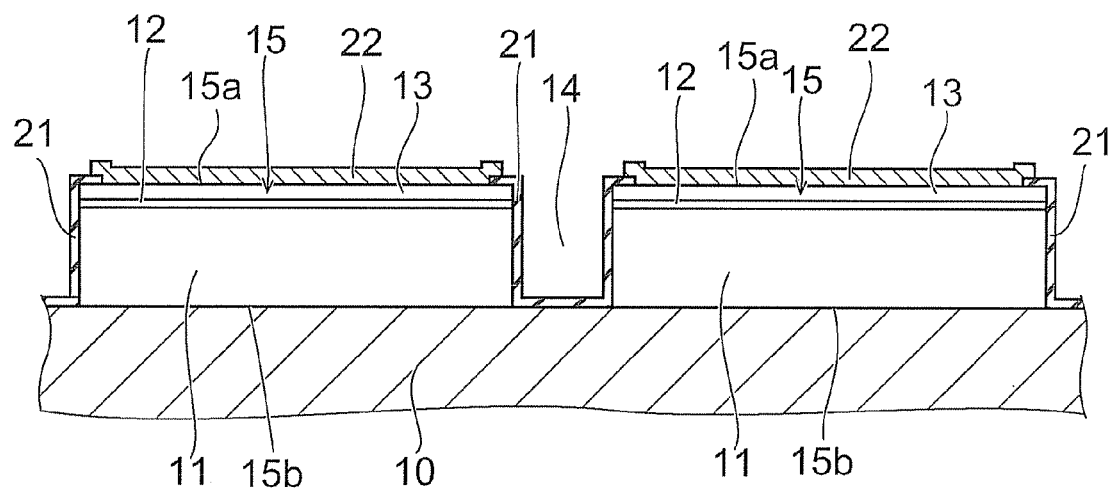

Then, using a not-illustrated mask, the insulating film 21 on the upper face of the semiconductor stack 15 (the upper face of the p-type semiconductor layer 13) is removed by, for example, wet etching. As illustrated in FIG. 4B, the p-side electrode 22 is formed on the p-type semiconductor layer 13 exposed by removing the insulating film 21. As illustrated in FIG. 9A, the p-side electrode 22 is formed on most of the upper face of the p-type semiconductor layer 13 excluding the peripheral portion. The p-side electrode 22 includes, for example, a nickel (Ni) film formed on the p-type semiconductor layer 13 and a silver (Ag) or aluminum (Al) film formed on the nickel film.

Figure 5A:
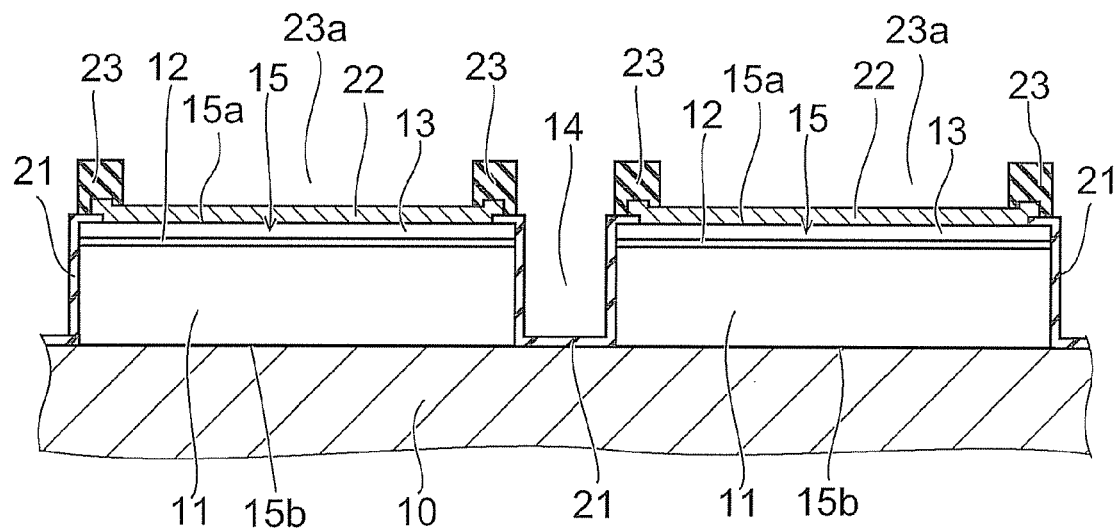
Figure 9B:
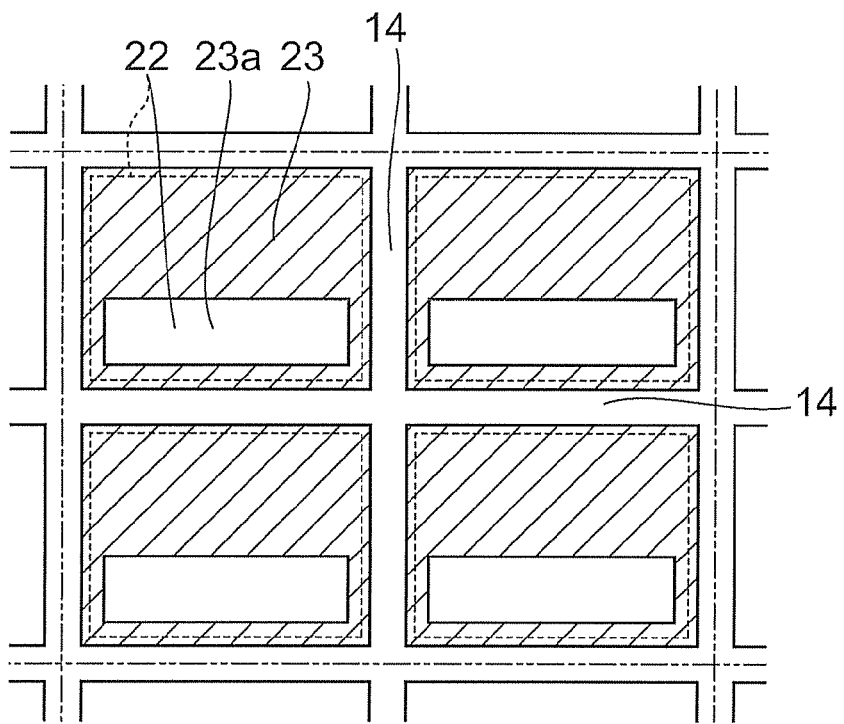

Continuing as illustrated in FIG. 5A and FIG. 9B, the insulator 23 of, for example, polyimide and the like, is formed on the p-side electrode 22. Subsequently, the opening 23a is made selectively. A portion of the p-side electrode 22 is exposed from the opening 23a.

Then, a not-illustrated seed metal (e.g., Cu) for plating is formed on the entire surface of the exposed portion above the substrate 10. The seed metal is formed on the upper face of the p-side electrode 22, the upper face and side face of the insulator 23, and the side face and the bottom face of the insulating film 21 in the trench 14.

Figure 5B:
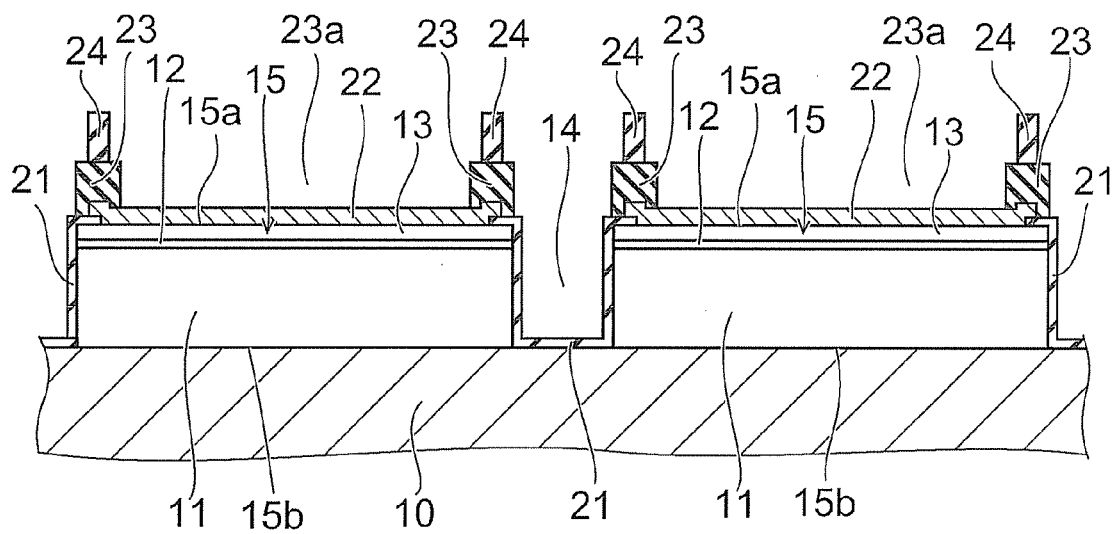

After forming the seed metal, a plating resist (e.g., a resin) 24 is formed on the insulator 23 around the opening 23a as illustrated in FIG. 5B and FIG. 10A.

Figure 6A:
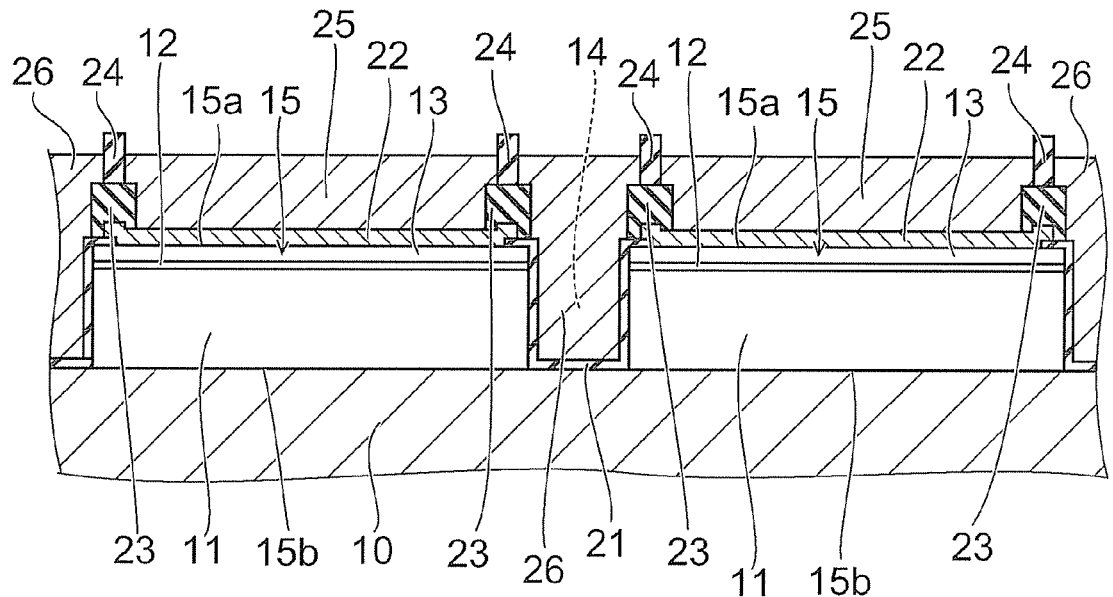

The p-side interconnect 25 and the n-side interconnect 26 are formed by plating using the seed metal recited above as a current path as illustrated in FIG. 6A and FIG. 10B. The p-side interconnect 25 and the n-side interconnect 26 may be made of the same metal material, e.g., copper (Cu), and may be formed simultaneously by plating.

The p-side interconnect 25 is formed on the p-side electrode 22 in the region enclosed with the plating resist 24. The n-side interconnect 26 is formed on the insulating film 21 on the side face and the bottom of the trench 14. Also, a portion of the n-side interconnect 26 is formed on the insulator 23 as the pad portion 26a. The n-side interconnect 26 is filled into the trench 14 and provided above the trench 14. The pad portion 26a is formed on the insulator 23 outside the region enclosed with the plating resist 24. The p-side interconnect 25 and the pad portion 26a are separated by the insulator 23 and the plating resist 24.

Figure 6B:
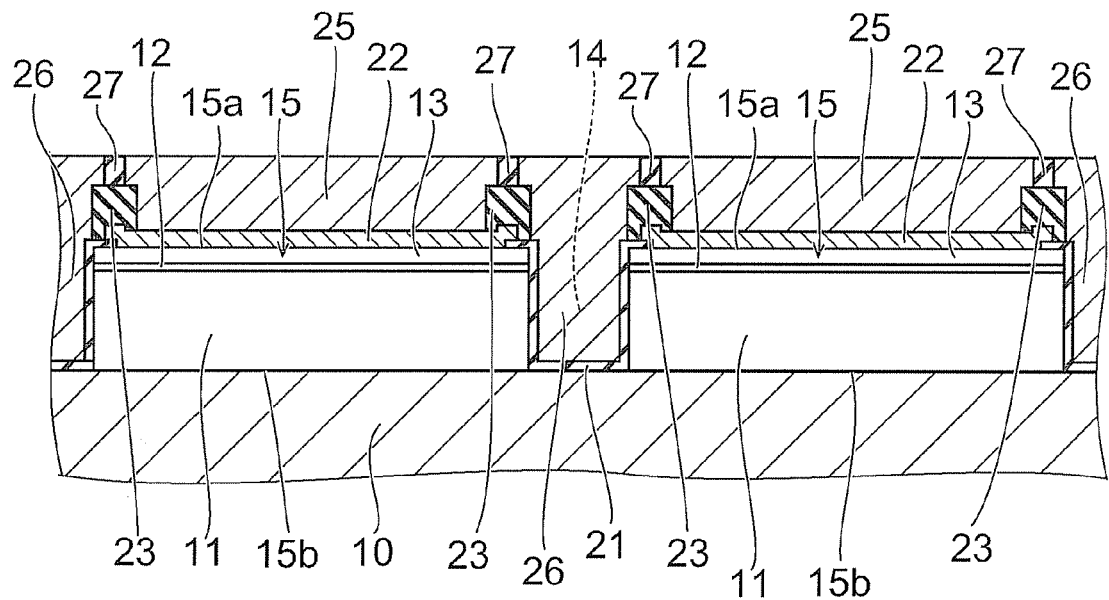

Then, the plating resist 24 is removed by, for example, a solution; and the seed metal is removed from the insulator 23 from which the plating resist 24 was removed. Thereby, the electrical connection between the p-side interconnect 25 and the n-side interconnect 26 via the seed metal is broken. The resin 27 is provided between the p-side interconnect 25 and the n-side interconnect 26 as illustrated in FIG. 6B. The resin 27 is formed with the same planar pattern as that of the plating resist 24 to separate the p-side interconnect 25 and the n-side interconnect 26 on the insulator 23.

Figure 7A:
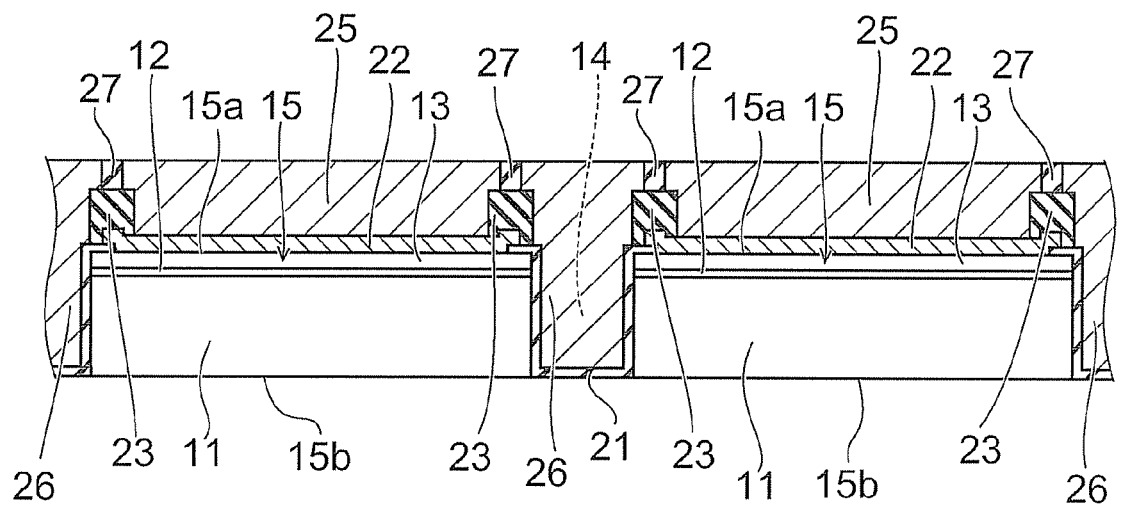

Continuing as illustrated in FIG. 7A, the substrate 10 is removed. The substrate 10 is separated from the semiconductor stack 15 by, for example, laser lift-off. Specifically, laser light is irradiated toward the second major surface 15b of the semiconductor stack 15 from the backside, i.e., the surface opposite to the major surface of the substrate 10 on which the semiconductor stack 15 is formed. The substrate 10 is transmissive with respect to the laser light; and the laser light has a wavelength in the absorption region of the semiconductor stack 15.

As the laser light reaches the interface between the substrate 10 and the second major surface 15b, the n-type semiconductor layer 11 proximal to the interface absorbs the energy of the laser light and decomposes. For example, in the case where the n-type semiconductor layer 11 is GaN, the n-type semiconductor layer 11 decomposes into Ga and nitrogen gas. The decomposition reaction results in a micro gap between the substrate 10 and the n-type semiconductor layer 11 to separate the substrate 10 and the n-type semiconductor layer 11. The laser light irradiation is performed multiply for each of the set regions over the entire wafer to remove the substrate 10.

Figure 7B:
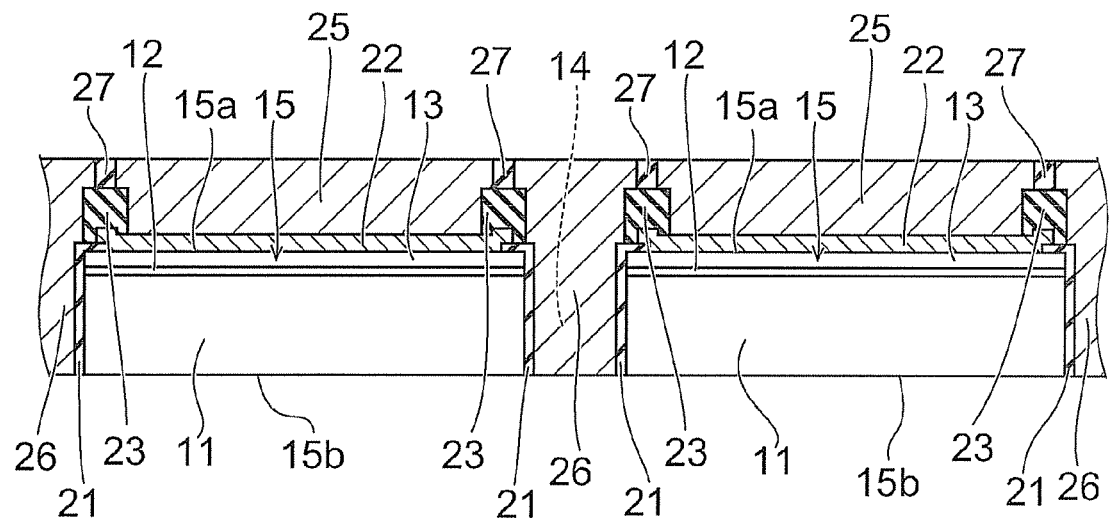

By removing the substrate 10, the insulating film 21 on the bottom of the trench 14 is exposed as illustrated in FIG. 7A. Then, for example, CMP (Chemical Mechanical Polishing) or etch-back is performed on the second major surface 15b of the semiconductor stack 15 and the insulating film 21 of the bottom of the trench 14 to remove the insulating film 21 of the bottom of the trench 14. Thereby, the n-side interconnect 26 of the bottom of the trench 14 is exposed as illustrated in FIG. 7B.

Figure 8A:
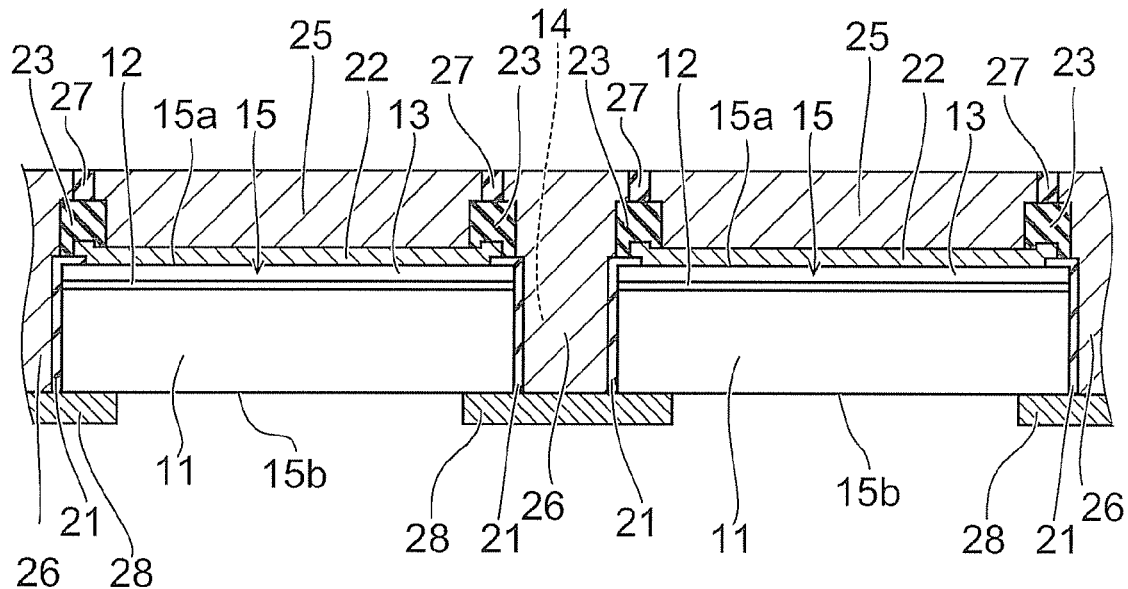

Then, as illustrated in FIG. 8A, the n-side electrode 28 is formed on the end face of the exposed n-side interconnect 26 on the second major surface 15b side and on the peripheral portion of the second major surface 15b on both sides of the end face. The n-side electrode 28 has an ohmic contact with the second major surface 15b and is metallically bonded to the n-side interconnect 26. Accordingly, the second major surface 15b is electrically connected to the n-side interconnect 26 via the n-side electrode 28. The n-side electrode 28 may include, for example, a titanium (Ti) film, an aluminum (Al) film, a nickel (Ni) film, a gold (Au) film, etc., formed in order from the second major surface 15b and n-side interconnect 26 side.

In the wafer state, the n-side electrode 28 may be formed, for example, in a lattice configuration along the trench 14 with a width wider than that of the trench 14. The portions of the n-side electrode 28 extending outside of the trench 14 contact the peripheral portion of the second major surface 15b. In other words, a common n-side electrode 28 may be formed for multiple semiconductor stacks 15 (chips) adjacent with the trench 14 interposed.

Figure 2B:
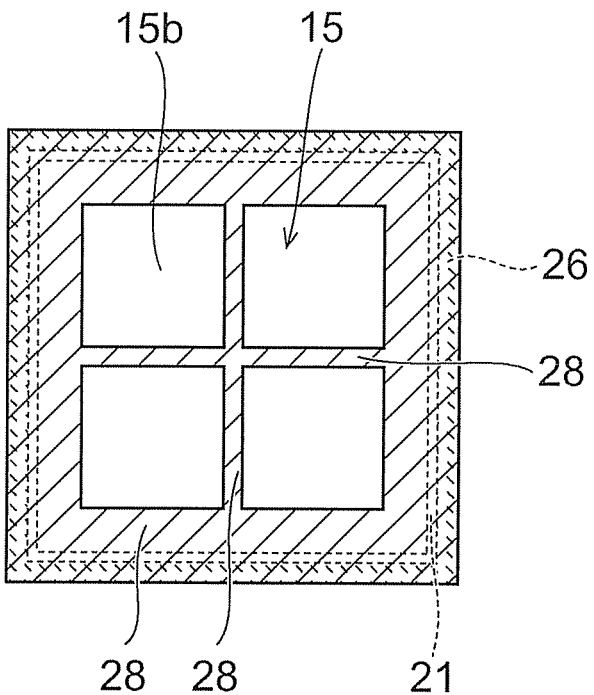
FIG. 2B shows a plan layout of another example.

The n-side electrode 28 is not limited only to the peripheral portion of the second major surface 15b. As illustrated in FIG. 2B, the n-side electrode 28 may be formed in a layout that crosses the second major surface 15b. In such a case, the current distribution of the second major surface 15*b* is more uniform; and the luminous efficacy can be increased.

Figure 8B:
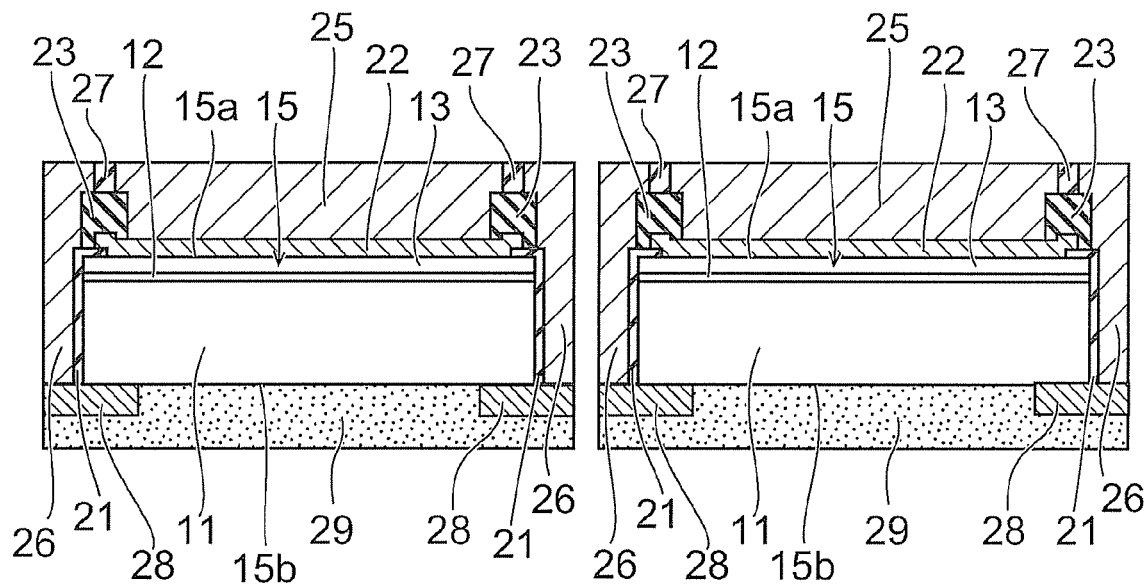

Then, as illustrated in FIG. 8B, the phosphor layer 29 is formed on the second major surface 15*b* to cover the n-side electrode 28. The phosphor layer 29 is formed by, for example, coating a resin having fluorescent particles mixed in a liquid by spin coating onto the second major surface 15*b* and subsequently curing.

By forming the phosphor layer 29 after removing the substrate 10 from the second major surface 15*b*, the substrate 10 does not exist between the phosphor layer 29 and the second major surface 15*b*, i.e., the light extraction face; and the light extraction efficiency can be increased.

Subsequently, as illustrated in FIG. 8B, singulation can be performed for the semiconductor light emitting devices by dicing the n-side interconnect 26 in the trench 14 by using, for example, a laser. Because the substrate 10 has already been removed, the singulation can be performed easily and the productivity can be increased.

Figure 11:
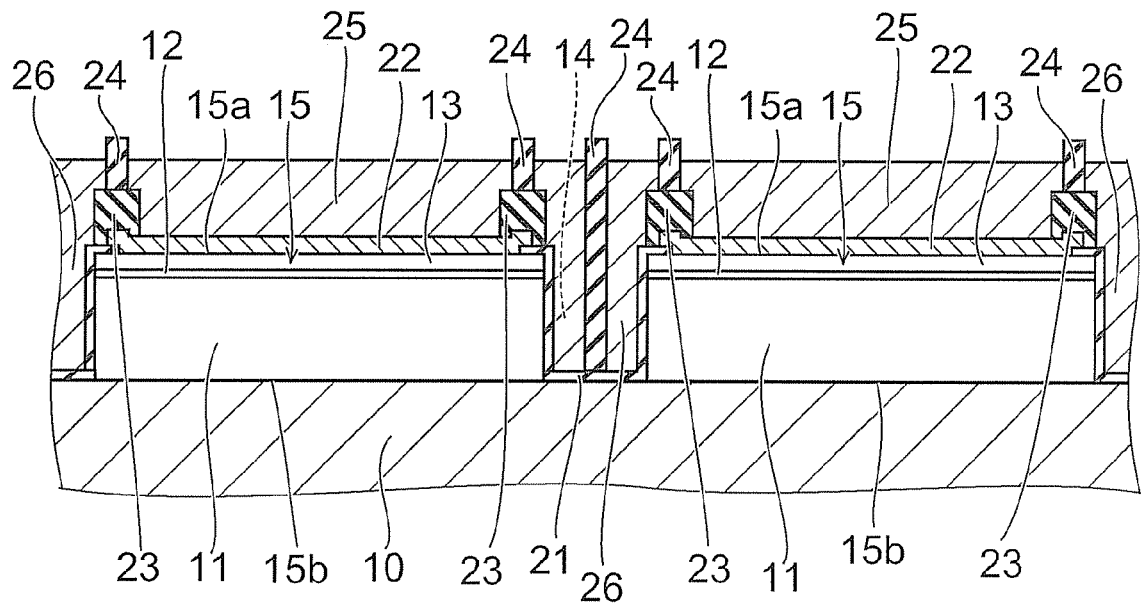
FIG. 11 is a schematic cross-sectional view illustrating another method for manufacturing a semiconductor light emitting device of this embodiment.

Alternatively, a resin may be provided at the dicing position; and the resin may be diced. For example, as illustrated in FIG. 11, the plating resist 24 may be formed also in the trench 14 when forming the plating resist 24 described above. By performing the plating in such a state, the n-side interconnect 26 is not formed in a portion of the trench 14.

The plating resist 24 of the trench 14 may be left without removal until the dicing. Alternatively, another resin may be provided in the trench 14 after the plating resist 24 is removed. In any case, by dicing the resin of the trench 14 during the dicing, singulation can be performed easily.

Because the processes described above are performed collectively in the wafer state up to the dicing, it is unnecessary to perform interconnects and packaging for each of the devices after the singulation; and drastic reductions of production costs are possible. In other words, in the state after performing singulation, the interconnects and packaging are already complete. Further, the planar size of each of the devices is near the planar size of the bare chip (the semiconductor stack 15); and downsizing is easier.

By making the trench 14 to separate the multiple semiconductor stacks 15 in the wafer state and providing the n-side interconnect 26 in the trench 14, a structure is obtained in which the n-side interconnect 26 is already formed on the side face of each of the semiconductor stacks 15 in the state after the singulation. Therefore, it is unnecessary to form the n-side interconnect 26 on the side face of each of the chips after the singulation.

The singulation is performed by dicing at a position enclosing at least one of the multiple semiconductor stacks 15 separated by the trench 14. For example, the semiconductor light emitting device may have a so-called multi-chip structure by dicing at a position of the trench 14 enclosing a region including multiple semiconductor stacks 15 as illustrated by the double dot-dash line in FIG. 9A.

In such a case, as illustrated in FIG. 8A, the multiple semiconductor stacks 15 have a structure in which the multiple semiconductor stacks 15 are connected via the n-side interconnect 26 provided on the side face. By performing the processes described above in the wafer state, a common n-side interconnect 26 and a common n-side electrode 28 can be formed for the multiple adjacent semiconductor stacks 15 having the trench 14 interposed therebetween; and the manufacturing efficiency is good.

Figure 12:
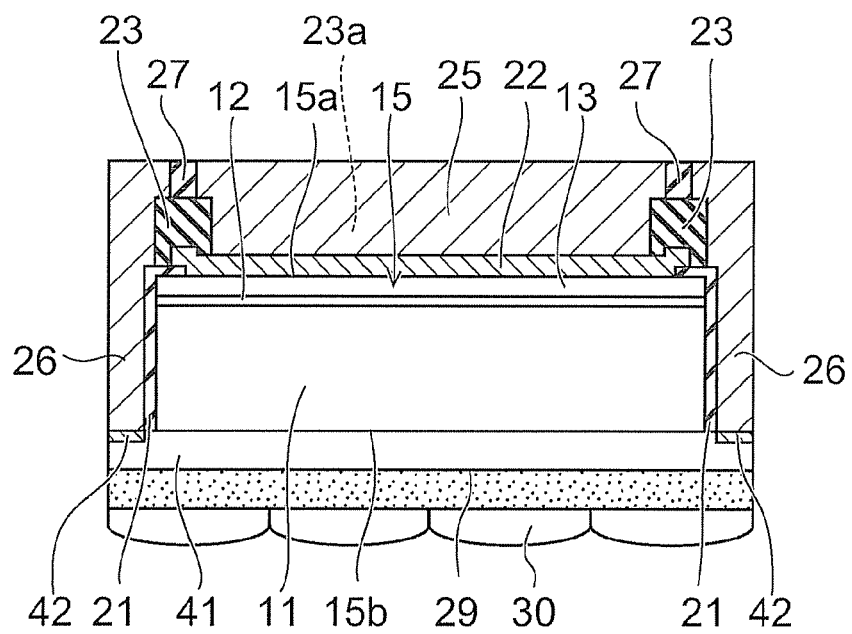
FIG. 12 is a schematic cross-sectional view of another example of the semiconductor light emitting device of this embodiment.

FIG. 12 is a schematic cross-sectional view of a semiconductor light emitting device of another embodiment.

In this embodiment, a transparent electrode 41 is used as the n-side electrode, where the transparent electrode 41 is transparent to the light emitted by the light emitting layer 12. For example, ITO (indium Tin Oxide) may be used as the transparent electrode 41. The transparent electrode 41 has ohmic contact with the second major surface 15*b* and is connected to the n-side interconnect 26 via a contact layer 42. Titanium (Ti), nickel (Ni), and the like, for example, may be used as the contact layer 42. Alternatively, the Ti, etc., for example, used as the seed layer during the plating of the n-side interconnect 26 may be used as the contact layer 42.

By using the transparent electrode 41, the n-side electrode can be formed on the entire surface of the second major surface 15*b*; the current distribution of the second major surface 15*b* can be more uniform; and high luminous efficacy can be obtained. It is unnecessary to perform patterning of the n-side electrode; and the processes are simplified.

Hereinabove, exemplary embodiments are described with reference to specific examples. However, the exemplary embodiments are not limited thereto. Various modifications are possible based on the technical spirit of the invention. One skilled in the art may perform various design modifications relating to substrates, semiconductor layers, electrodes, interconnects, metal pillars, insulating films, resin materials, sizes, configurations, layouts, and the like; and such design modifications are included in the scope of the invention to the extent that the purport of the invention is included.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor light emitting device, comprising:
   a semiconductor stack including a first major surface, a second major surface provided on a side opposite to the first major surface, a side face, and a light emitting layer;
   a first electrode provided on the first major surface;
   a second electrode provided on an outside part of the second major surface, wherein a portion of the second electrode protrudes beyond the second major surface;
   a first interconnect provided on the first electrode;
   an insulating film provided on the side face of the semiconductor stack; and
   a second interconnect provided on the side face of the semiconductor stack via the insulating film and provided on the portion of the second electrode protruding beyond the second major surface, the second interconnect being connected to the second electrode outside of a peripheral portion of the second major surface of the semiconductor stack, the second interconnect protruding from the side face toward the first major surface, the second interconnect including a pad portion overlapping the first electrode via an insulator interposed between the pad portion and the first electrode.

2. The device of claim 1, wherein the second electrode is formed continuously on the peripheral portion of the second major surface to enclose a center of the second major surface.

3. The device of claim 1, wherein the second electrode is transparent to light emitted from the light emitting layer.

4. The device of claim 3, wherein the second electrode is connected to the second interconnect via a contact layer.

5. The device of claim 1, wherein the second electrode and the second interconnect are metallically bonded.

6. The device of claim 1, further comprising a phosphor layer covering the second electrode and opposing the second major surface.

7. The device of claim 6, wherein the phosphor layer is also provided below the second interconnect.

8. The device of claim 1, wherein the first interconnect has an end portion which is connectable to a mounting member, and the second interconnect has an end portion which is connectable to a mounting member.

9. A semiconductor light emitting device, comprising:
- a semiconductor stack including a first major surface, a second major surface provided on a side opposite to the first major surface, a side face, and a light emitting layer;
- a first electrode provided on the first major surface;
- a second electrode provided on an outside part of the second major surface, wherein a portion of the second electrode protrudes beyond the second major surface;
- a first interconnect provided on the first electrode;
- an insulating film provided on the side face of the semiconductor stack; and
- a second interconnect provided on the side face of the semiconductor stack via the insulating film and provided on the portion of the second electrode protruding beyond the second major surface, the second interconnect being connected to the second electrode outside of a peripheral portion of the second major surface of the semiconductor stack, the second interconnect continuously surrounding an entire outer portion of the semiconductor stack via the insulating film.

\* \* \* \* \*